United States Patent [19]

Van Uffelen et al.

[11] Patent Number: 4,546,326
[45] Date of Patent: Oct. 8, 1985

[54] FAST AUTOMATIC GAIN CONTROL ARRANGEMENT

[75] Inventors: Jean-Pierre H. Van Uffelen, Chevilly Larue; Daniel Robillard, Elancourt; Michel LeBourg, Clamart, all of France

[73] Assignee: U.S. Philips Corporation, New York, N.Y.

[21] Appl. No.: 461,718

[22] Filed: Jan. 28, 1983

[30] Foreign Application Priority Data

Feb. 3, 1982 [FR] France .................. 82 01722

[51] Int. Cl.⁴ .......................................... H03G 3/20
[52] U.S. Cl. ..................... 330/129; 330/279; 455/234
[58] Field of Search ............. 330/127, 129, 141, 278, 330/281; 455/185, 186, 234, 244; 375/58

[56] References Cited

FOREIGN PATENT DOCUMENTS 1599401 9/1981 United Kingdom .............. 330/129

Primary Examiner—James B. Mullins
Attorney, Agent, or Firm—Joseph P. Abate

[57] ABSTRACT

Fast automatic gain control (AGC) arrangement provided in an RF receiver which receives data from high-rate multiple transmission channels, in which the AGC amplifier (1) is controlled by a control voltage read from a random access memory RAM (2) which renders it possible to repeat once or several times consecutively the measurement and the correction of the output voltage of the amplifier during the period of time in which a channel is in use, the control voltage correction signal being processed in a circuit (6-10) for measuring and comparing the output voltage of the AGC amplifier to which a read-only memory (PROM)(11) is added which provides a means for correcting the imperfections of the amplifier (1) and of said measuring and comparison circuit.

4 Claims, 3 Drawing Figures

FAST AUTOMATIC GAIN CONTROL ARRANGEMENT

BACKGROUND OF THE INVENTION

The invention relates to a fast automatic gain control arrangement provided in the intermediate frequency portion of a radio-frequency receiver receiving data from multiple transmission channels with frequent channel change. Such an arrangement includes an AGC amplifier which, when a channel is in use, is controlled by applying to it a control voltage whose digital value is taken from a memory in which this value was stored during the preceding use of the channel, and is also transferred to an adder for adding it algebraically to the digital value of a correction signal produced in a circuit for measuring and comparing the output voltage of the AGC amplifier in order to provide the digital value of the corrected control voltage.

In an amplitude-modulated transceiver set, a conventional AGC arrangement is formed by a phase-locked loop comprising a variable-gain amplifier which is included in the intermediate frequency portion of the receiver and a circuit for processing the control voltage obtained by detection of the signal at the output of the amplifier. A serious and often difficult problem is the optimization of the time constants of the activator and deactivator devices, the time constant of the activator device being the higher constant having a duration of some hundreds of milliseconds.

In certain transceiver apparatuses which are used particularly for data transmission, the transmission is effected in accordance with the high-rate multiple channel method. This is, for example, the case with frequency-deviation links which are usually designed for secret transmissions and multi-point link systems. Because the time interval relative to a frequency level or to an establishment of links with points where several participants are located can be very short, the comparatively long time constants of a conventional AGC arrangement are the main limitation of such systems.

A faster-responding automatic gain control arrangement, which takes these specific operating conditions into account and whose design is identical to the arrangement already set forth in the opening paragraph, is described in French Patent Specification No. 2,075,201. That arrangement relates to a transceiver by means of which variable-frequency data transmission is possible. The AGC amplifier is controlled by a memory which is formed by a matrix comprising a shift register which operates at the rate at which the frequency changes and whose number of memory locations is the same as the number of frequencies of the transmitted carrier. Knowing the previous state of the control voltage level stored in the memory and the fact that the frequency changes are utilized with such a recurrence that the variations of the signal attenuations between two consecutive uses of the same frequency are comparatively small renders it possible to reduce the response time of the arrangement. It should, however, be noted that the corrected value of the control voltage conveyed to the first register cannot be applied to the AGC amplifier until after it has arrived in the last register, that is to say at the end of a time interval equal to the repetition period of the successive frequencies.

SUMMARY OF THE INVENTION

It is an object of the present invention to increase more specifically the speed and the precision of the arrangement by enabling re-use of the control voltage immediately after it has been corrected and by introducing a means for compensating for the imperfections of the several components of the control loop.

For this purpose, according to the invention, the processing of said control voltage correction signal during which operation this voltage is kept constant and the subsequent application of said corrected control voltage to the AGC amplifier in order to keep its output level substantially constant are effected during part of the time said channel is employed and can be repeated once or several times during the remainder of said time, the last digital value of the corrected control voltage being stored in the memory, said memory being a random access memory (RAM) which is addressed by a generator generating the addresses of the several channels, said circuit for measuring and comparing the output voltage of the AGC amplifier comprising furthermore a read-only memory (PROM) which is addressed in zones in which there are arranged in accordance with different measured levels of the control voltage the predetermined corresponding values of said correction signal readjusted to allow for the imperfections of said AGC amplifier and of said measuring and comparison circuit, said digital value of the control voltage read from the random access memory and transferred to the read-only memory determining therein the appropriate zone for the selection of said readjusted correction signal, whose digital value is transferred to the adder at whose output the digital value of the corrected control voltage is obtained, adapted to said imperfections.

The following description which is given by way of example with reference to the accompanying drawings will make it better understood how the invention can be put into effect.

DESCRIPTION OF THE PREFERRED EMBODIMENTS

Figure 1:
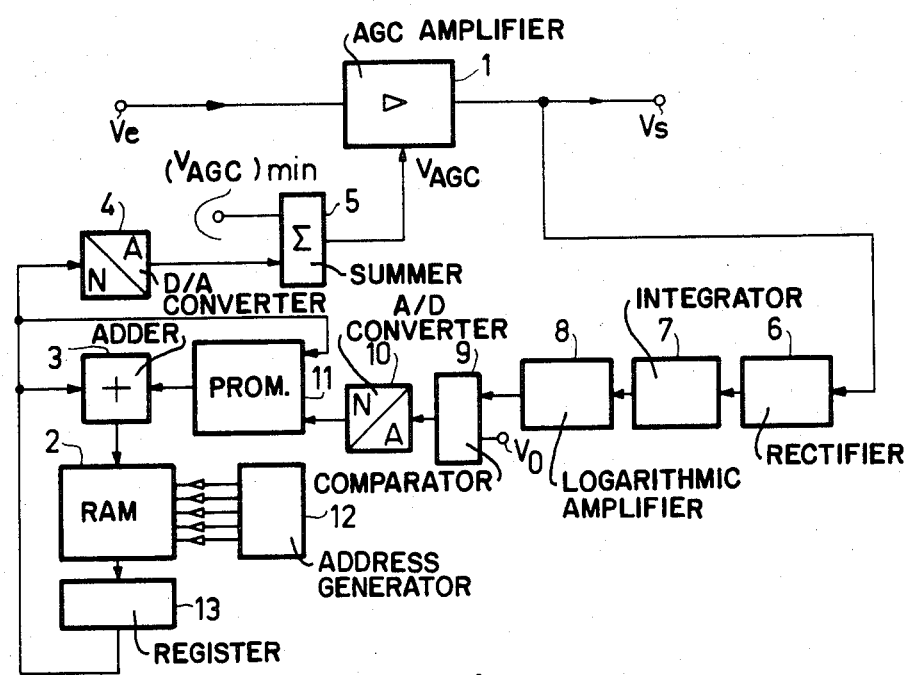
FIG. 1 shows the block diagram of the fast automatic gain control arrangement according to the invention.

The fast automatic gain control arrangement shown in FIG. 1 comprises an AGC amplifier 1 arranged in the intermediate frequency portion of the receiver of, for example, a frequency-distortion system. The amplifier 1 has a variable input level $V_e$ and an output level $V_s$ which one tries to keep constant by applying a control voltage whose digital value is read from a memory 2 during the use of a given frequency and is algebraically added in an adder 3 to the digital value of a correction signal produced in a circuit for measuring and comparing the output voltage of the amplifier 1 to produce a digital value of the corrected control voltage. The digital value is read from said memory 2 during the preceding use of said frequency. This value is converted into an analogue value in a digital-to-analogue converter 4 and added at a summer 5 to a fixed voltage $(V_{AGC})_{min}$ which, if required, determines a minimum threshold for the control voltage $V_{AGC}$ applied to the amplifier 1. The signal $V_s$ at the output of the amplifier 1 is detected and processed in said measuring and comparison circuit, 5 which comprises a rectifier 6, a reset-to-zero integrator 7, in order to obtain a mean value of the signal, and a logarithmic amplifier 8 whose linear output voltage in decibels is compared in a comparator 9 with a voltage threshold having the value $V_o$ which is equal to the voltage which will be generated at the output of the logarithmic amplifier 8 when the AGC amplifier 1 supplies its nominal output voltage $V_{so}$. Thus, at the output of the comparator 9, a positive or negative correction value, depending on the sense of the error, is obtained whose value is converted into the digital form in the analogue-to-digital converter 10 so as to make it suitable for transfer to the adder 3.

It is advantageous to provide that, immediately after its correction, the corrected value of the control voltage transferred to the memory 2 can be used again. To that end, in accordance with the invention, said memory is a random access memory which receives the addresses of the different frequencies from an address generator 12. Frequency addressing which may be effected in a pseudo-random way is provided by a frequency selection program handling system, not shown. Let it be assumed that synchronizing the program of the emitter with the program of the receiver is ensured by any suitable method, for example at the beginning of the transmission. The digital signal at the output of the memory 2 is resampled in a register 13 before it is converted to the analogue form. On the other hand, the arrangement in accordance with the invention renders it also possible to correct the imperfections of the AGC amplifier and of the measuring and comparison circuit of its output voltage. For that purpose a read-only memory (PROM) 11, included between the analogue-to-digital converter 10 and the adder 3, is addressed in zones in which there are arranged, according to the experimental values of the control voltage, the corresponding values of the correction signal, readjusted to allow for these imperfections. The digital value of the control voltage taken from the memory 2 and transferred to the memory 11 then determines the appropriate zone for the selection of the readjusted correction signal. This signal is transferred to the adder 3, whose output supplies the digital value of the corrected control voltage, adapted to said imperfections.

This arrangement operates as follows. At the instant t at the change from the frequency $f_i$ to the frequency $f_j$, the control voltage $(V_{AGC})_i$ required for the control of the control loop at the instant t and at the frequency $f_i$ is first stored in random access memory 2. The value $(V_{AGC})_j$ which corresponds to the last use of the channel j is thereafter read from the memory 2, applied to the amplifier 1 and kept constant during a portion of the time in which the channel j is employed. During this period of time, the output voltage of the amplifier 1 is measured and procesed and the result of this measurement and of this processing action is compared with a threshold $V_o$ which corresponds to the nominal output voltage $V_{so}$ of the amplifier. A correction signal $(\Delta V_{AGC})_j$ is derived from this comparison.

There would be no need for the memory (PROM) 11 if the following ideal conditions were realized: linearity of the gain characteristic of the AGC amplifier, a perfect operation of the longarithmic amplifier, the absence of distortion in the system for measuring the output signal of the AGC amplifier, of the rectifier in particular. This would then result, expressed in logarithmic coordinates, in a linear variation of the gain characteristic G of the AGC amplifier and of the circuit for measuring and comparing its outputs ignal as a function of the input level $V_e$ and an accurate measurement in decibels.

Figure 2:
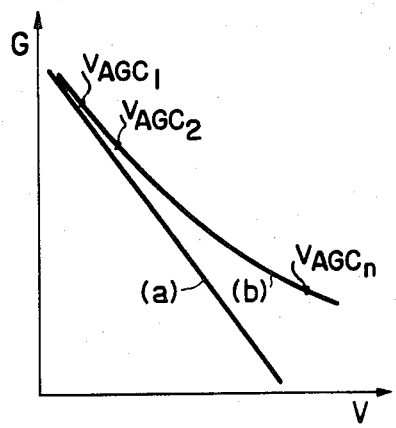
FIG. 2 shows, by means of logarithmic coordinates, the ideal and experimental forms of the gain characteristic of the AGC amplifier and of its measuring and comparison circuit as a function of its input level.

FIG. 2 in which this ideal linear variation (a) and the experimental variation (b) are represented shows the progress of their deviation which increases versus the input level. Different control voltage levels $V_{AGC1}$, $V_{AGC2}$, ... $V_{AGCn}$ are shown as parameters on the experimental characteristic.

Figure 3:
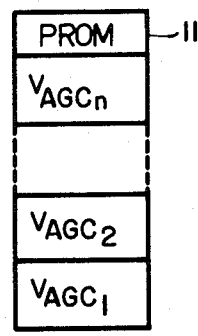
FIG. 3 shows the addressing zones of the read-only memory for different measured values of the control voltage.

The read-only memory (PROM) 11 has for its function to correct the imperfections of the AGC amplifier and of the output voltage of the measuring and comparing circuit. To that end, the read-only memory is divided into different zones, shown in FIG. 3, which each correspond to a voltage value $V_{AGC}$ supplied by the experimental characteristic. Dual addressing of this PROM by the digital data of the control voltage and of its correction signal renders it possible to establish a bi-univocal correspondance between the pair: the applied $(V_{AGC})_j$ voltage and the deviation $V_s - V_{so}$ between the output voltage of the amplifier 1 and its nominal value on the one hand and the correction term $(\Delta V_{AGC})_j$ on the other hand, the predetermined value of the correction signal $(\Delta V_{AGC})_j'$ readjusted to take the non-linearity of the experimental characteristic of the gain G into account being arranged in that zone of the memory 11 which corresponds to the applied level of $(V_{AGC})_j$.

The value of $(\Delta V_{AGC})_j'$ which is written into the memory of the PROM is added algebraically in the adder 3 to the value of $(V_{AGC})_j$ supplied by the RAM to determine the value of the corrected control voltage.

When the correction has been effected, the sampling register 13 enables this value of the corrected control voltage to be applied, via the memory 2, which has been rendered transparent and the digital-to-analogue converter 4 to the amplifier 1, such that it modifies the gain therein in such a way as to have the amplifier output voltage approximate the desired nominal value. Thus, in such a fast AGC arrangement, the correction is effected after the measurement, while in a conventional AGC arrangement the measurement and the correction are effected simultaneously. During the remaining period of time in which the channel j is employed the same measuring and correction operations can be effected again once or several times depending on the period of time during which the channel is employed according to which the last value of the corrected control voltage is stored.

It should be noted that a fast AGC arrangement is particularly suitable for data transmission systems, whose signals have a comparatively well concentrated spectrum which is comparatively free from low frequencies. It is a known fact that the lowest frequencies of the spectrum of the modulating signal are transmitted less satisfactorily according as such an arrangement is faster, its response time having the tendency to approximate the rise time of the low-frequency signal.

What is claimed is:

1. A fast automatic gain control arrangement for use in an intermediate frequency portion of a radio-frequency receiver which receives data from multiple transmission channels with frequent channel change, the arrangement comprising:

an amplifier having an imput signal terminal, an output signal terminal, and a control signal terminal;

means for storing a digital control signal, the digital control signal depending upon the frequency of an input signal present at the input terminal, the storing means having an output connected to the control signal terminal of the amplifier and also having a corrected digital control signal input;

means for measuring an output signal present at the output signal terminal and producing a digital correction signal which depends upon the output signal;

means for producing a readjusted digital correction signal which depends upon the digital control signal and also upon the digital correction signal, the readjusted digital correction signal producing means having an output, and means for adding the digital control signal and the readjusted digital correction signal and producing a corrected digital control signal at an output of the adding means, the output of the adding means being connected to the corrected digital control signal input of the storing means.

2. An arrangement as claimed in claim 1, wherein the storing means includes a random access memory.

3. An arrangement as claimed in claim 2, further comprising a frequency-address generator connected to the random access memory.

4. An arrangement as claimed in claim 1, wherein the means for producing a readjusted digital correction signal includes a read-only memory connected between the adding means and the measuring and producing means.

* * * * *